United States Patent [19]

Bailey et al.

[11] Patent Number: 5,527,480

[45] Date of Patent: Jun. 18, 1996

[54] PIEZOELECTRIC CERAMIC MATERIAL INCLUDING PROCESSES FOR PREPARATION THEREOF AND APPLICATIONS THEREFOR

[75] Inventors: Alex E. Bailey, Cockeysville; Inam Jawed, Columbia; Andrew P. Ritter, Baltimore; Audrey E. Sutherland, Eldersburg; Stephen R. Winzer, Columbia, all of Md.

[73] Assignee: Martin Marietta Corporation, Bethesda, Md.

[21] Appl. No.: 60,399

[22] Filed: Jun. 11, 1987

[51] Int. Cl.$^6$ ............................ C04B 35/46; C04B 35/64
[52] U.S. Cl. ............................ 252/62.9; 264/63; 264/66; 501/136
[58] Field of Search ............................ 252/62.9 R, 62.9; 501/136, 137, 138, 139, 134, 136; 264/63, 66; 423/598; 367/157, 159

[56] References Cited

U.S. PATENT DOCUMENTS

| | | | |
|---|---|---|---|
| 2,420,864 | 5/1947 | Chilowsky | 252/62.9 |
| 3,330,697 | 7/1987 | Pechini | 501/138 |
| 3,403,103 | 9/1968 | Ouchi et al. | 252/62.9 |
| 3,546,120 | 8/1968 | Ouchi et al. | 252/62.9 |
| 3,689,414 | 4/1970 | Watanabe et al. | 252/62.9 |
| 3,725,298 | 4/1973 | Woodhead et al. | 501/94 |
| 3,728,263 | 4/1973 | Nishida et al. | 252/62.9 |
| 3,741,899 | 6/1973 | Koyano | 252/62.9 |
| 4,140,992 | 2/1979 | Wardle | 340/9 |
| 4,152,281 | 5/1979 | Arendt et al. | 252/62.9 |
| 4,158,189 | 6/1979 | Wardle | 340/9 |
| 4,227,111 | 10/1980 | Cross et al. | 310/358 |
| 4,412,148 | 10/1983 | Klicker et al. | 310/358 |
| 4,422,003 | 12/1983 | Safari et al. | 310/358 |
| 4,485,321 | 11/1984 | Klicker et al. | 310/3.2 |
| 4,613,784 | 9/1986 | Haun et al. | 310/358 |
| 4,626,369 | 12/1986 | Walker, Jr. | 252/62.9 |

FOREIGN PATENT DOCUMENTS

| | | | |
|---|---|---|---|
| 47-9510 | 3/1972 | Japan . | |
| 47-51157 | 12/1972 | Japan . | |
| 49-42638 | 11/1974 | Japan | H01V 7/02 |
| 58-204578 | 11/1983 | Japan | H01L 41/18 |
| 58-204578A | 11/1983 | Japan | 252/62.9 |
| 56-2690 | 1/1986 | Japan | C04B 35/46 |
| 61-129888 | 6/1986 | Japan | C04B 35/49 |

OTHER PUBLICATIONS

The American Ceramic Society, Inc. 90th Annual Meeting Abstracts Cincinnati Convention Center Cincinnati, Ohio May 1–May 5, 1988.
The American Ceramic Society, Inc. 90th Annual Meeting Abstracts Cincinnati, Convention Center Cincinnati, Ohio May 1–May 5, 1988.
The American Ceramic Society, Inc. 90th Annual Meeting Talk Summaries Cincinnati Convention Center Cincinnati, Ohio May 1–5, 1988.
The American Ceramic Society, Inc. 90th Annual Meeting Talk Summaries Cincinnati Convention Center Cincinnati, Ohio May 1–5, 1988.

(List continued on next page.)

*Primary Examiner*—Donald P. Walsh
*Assistant Examiner*—John N. Greaves
*Attorney, Agent, or Firm*—Gay Chin; Bruce M. Winchell; Henry J. Groth

[57] ABSTRACT

This invention relates to new ceramic piezoelectric compositions having superior electrical properties, processes for the preparation of the new piezoelectric composition and applications for the new compositions. Specifically, a solid solution composition of 85.5–87.5 molar percent lead zinc niobate, 9.5–9.7 molar percent lead titanate and 3–5 molar percent of a barium titanate dopant or strontium titanate dopant has exhibited desirable electrical properties. This specific composition is well suited for use in a 3–1 connectivity composite, which can be used as a hydrophone. These compositions may be prepared by oxide sintering techniques utilizing extremely high purity materials, or alternatively, by a sol gel process.

25 Claims, 9 Drawing Sheets

OTHER PUBLICATIONS

The American Ceramic Society, Inc. 90th Annual Meeting Talk Summaries Cincinnati Convention Center Cincinnati, Ohio May 1–5, 1988.

The American Ceramic Society, Inc. 89th Annual Meeting Poster Session David Lawrence Convention Center Pittsburgh, PA Apr. 26–28, 1987.

The American Ceramic Society, Inc. 88th Annual Meeting Abstracts Hyatt Regency Chicago Chicago, IL Apr. 27–May 1, 1986.

Proceedings at the Sixth IEEE International Symposium on Applications of Ferroelectrics Lehigh University Bethlehem, PA Jun. 8–11, 1986.

The American Ceramic Society, Inc. 89th Annual Meeting Abstracts David Lawrence Convention Center Pittsburgh, PA Apr. 26–18, 1987.

"Advanced Ceramics and Composites for Underwater Acoustic and Engineering Applications" Naval Research Laboratory Memorandum Report 3854, Oct. 18, 1978 Naval Research Laboratory Washington, D.C.

"Flexible Composite Transducers" D. P. Skinner R. F. Newnham and L. E. Cross Mat. Res. Bull. vol. 13, pp. 599–607, 1978 Pergamon Press, Inc.

"Composites of PZT and Epoxy for Hydrostatic Transducer Applications" K. A. Klicker, J. V. Biggers, R. E. Newnham Journal of the American Ceramic Society vol. 64, No. 1, Jan., 1981.

"Composite Piezoelectric Sensors" R. E. Newnham, A. Safari, J. Giniewicz, B. H. Fox Ferroelectrics, 1984, vol. 00, pp. 000–000 1984 Gordon and Breach Science Publishers, Inc.

"Ferroelectric Composites for Hydrophones" S. Y. Lynn, R. E. Newnham, K. A. Klicker, K. Rittenmyer, W. A. Schulze Ferroelectrics, 1981, vol. 38, pp. 955–958 1981 Gordon and Breach, Science Publishers, Inc.

"Composite Piezpelectric Transducers" R. E. Newnham, L. J. Bowen, K. A. Klicker L. E. Cross Materials Engineering vol. 2, pp. 93–106, 1980.

"Connectivity and Piezpelectric–Pyroelectric Composites" R. E. Newnham, D. P. Skinner, L. E. Cross Mat. Res. Bull. vol. 13, pp. 525–536, 1978 Pergamon Press, Inc.

"Flexible Composite Transducers" A. Safari, A. Halliyal, L. J. Bowen, R. E. Newnham Journal of the American Ceramic Society vol. 65, No. 4, Apr., 1982.

Abstract of Oral Presentation (Paper No. 28–EP–86); "Stabilization of Perovskite Phase in the $Pb(Zn_{1/3} Nb_{2/3})O_3$–$PbTiO_3$–$BaTiO_3$ System and Dielectric and Piezoelectric Properties" Presentation Date: Apr. 30, 1986.

"Modified Lead Zinc Niobate Ceramic Electrostrictors for Micropositioner Applications", Presented at Lehigh University Jun. 10, 1986.

"Dielectric and Piezoelectric Properties of $Pb(Zn_{1/3}Nb_{2/3})O_3$–$PbTiO_3$–$BaTiO_3$ Ceramics", Presented at Lehigh University, Jun. 10, 1986.

Baumler et al., "Dielectric and Piezoelectric Properties of $Pb(Zn_{1/3}Nb_{2/3})O_3$–$PbTiO_3$–$BaTiO_3$ Ceramics", Jun. 1986.

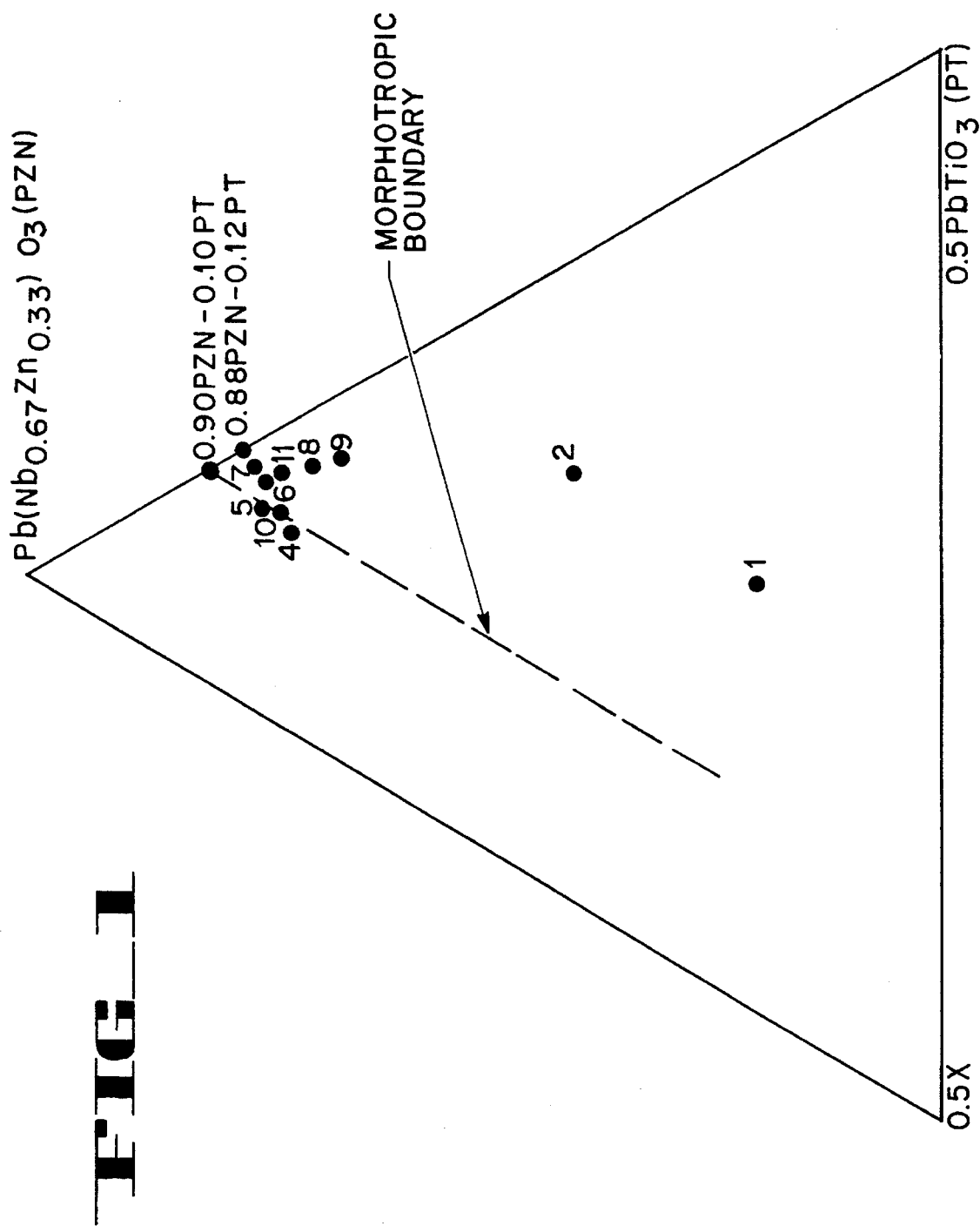

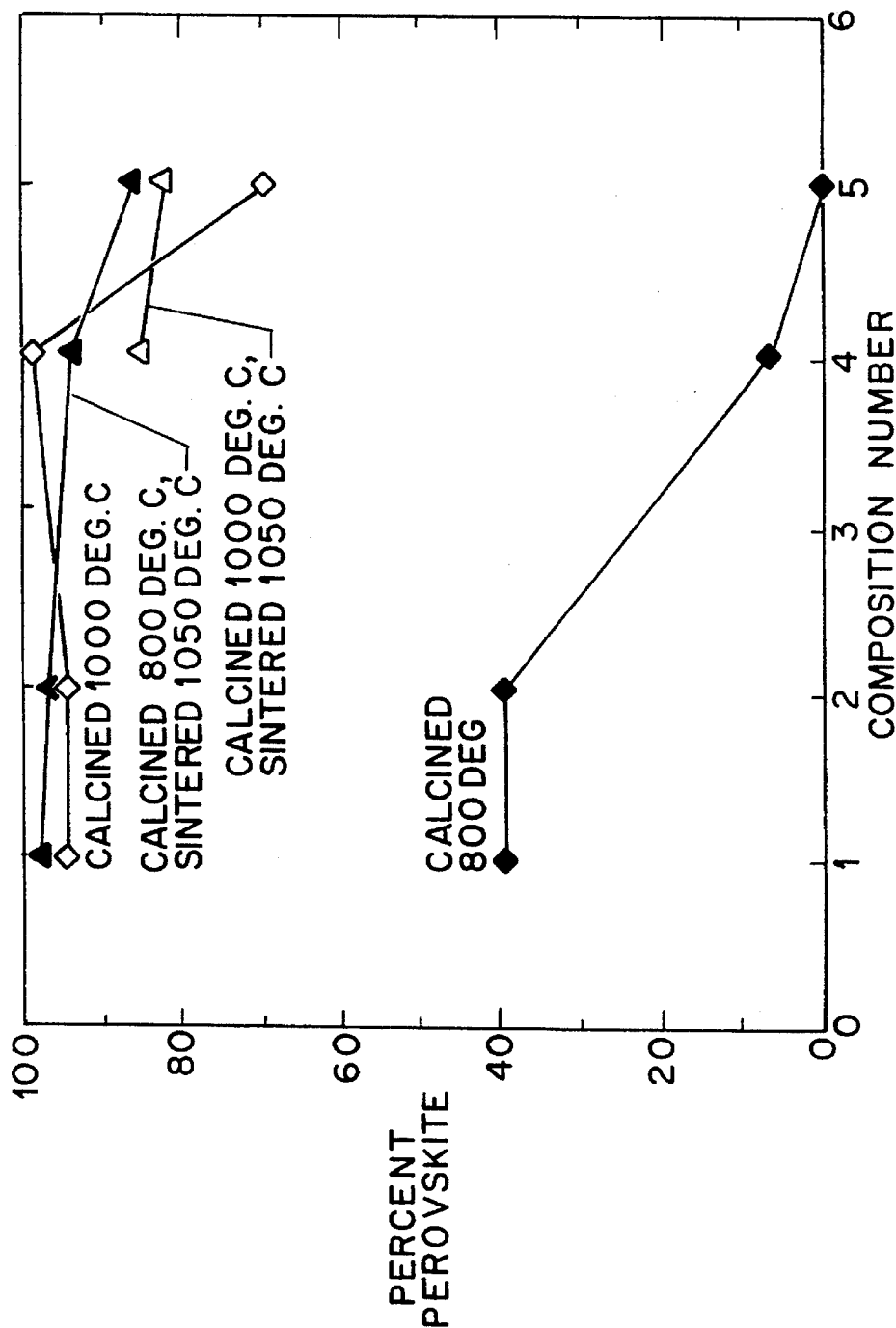
FIG_2

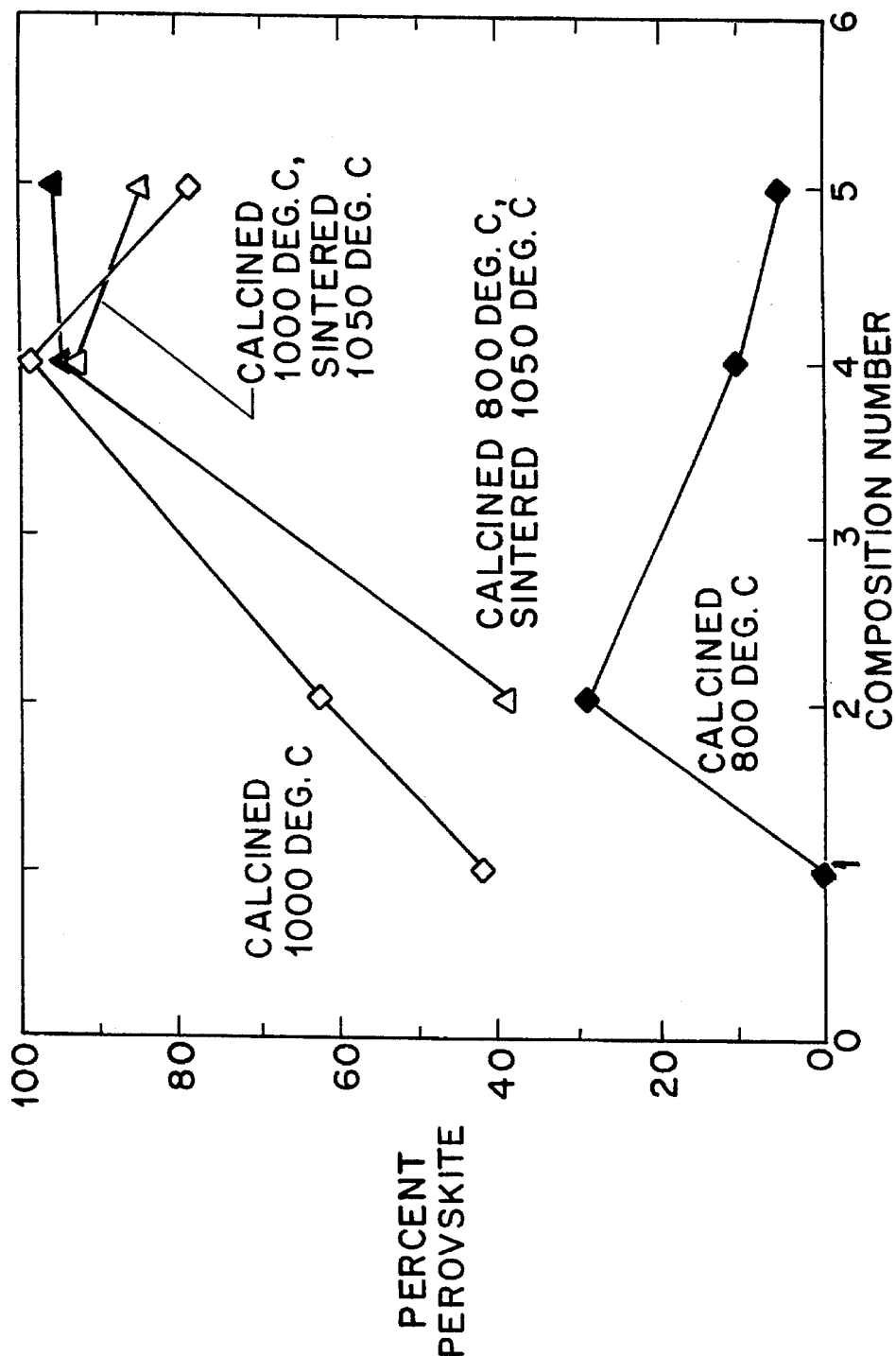
FIG_3

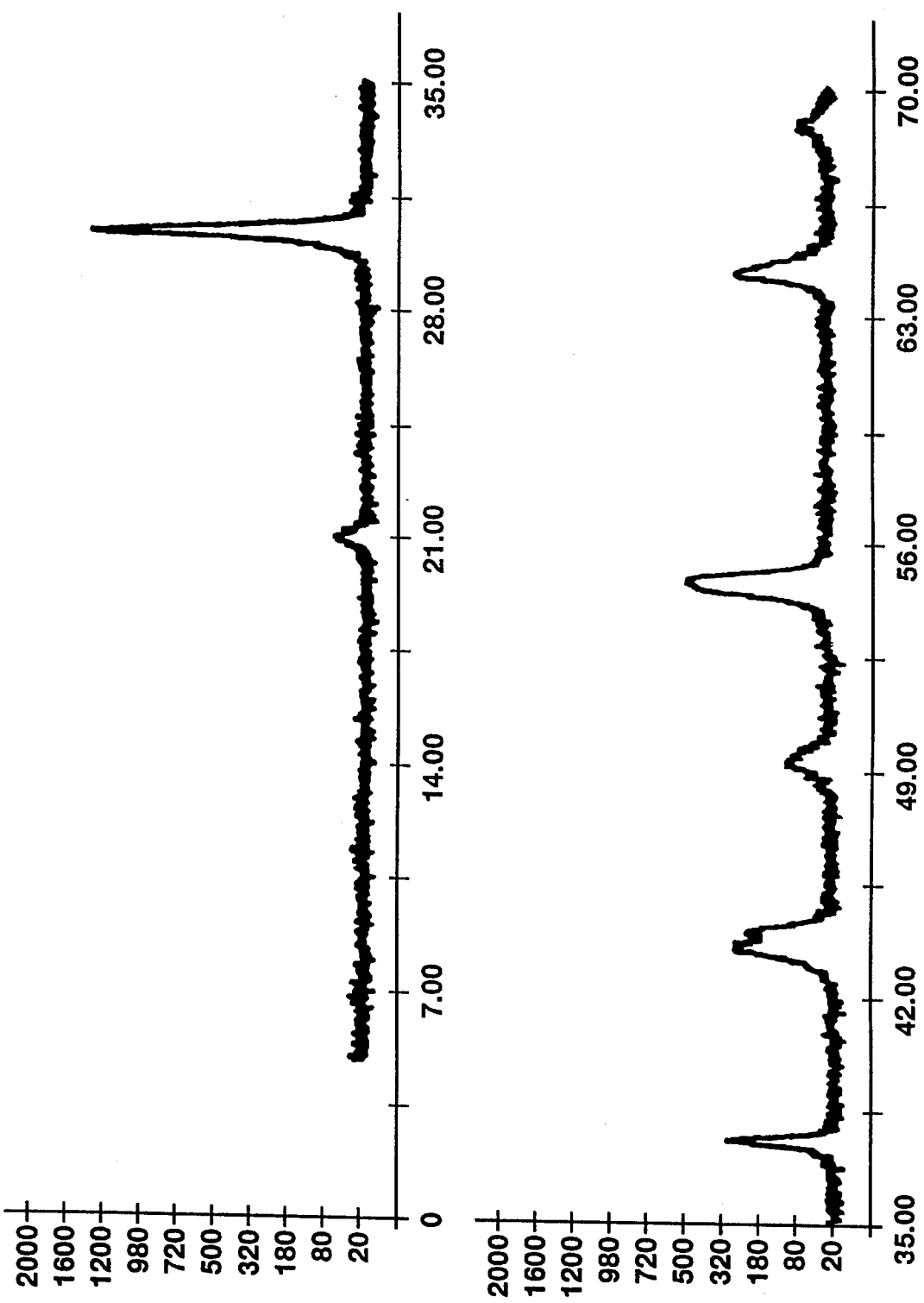
FIG_4

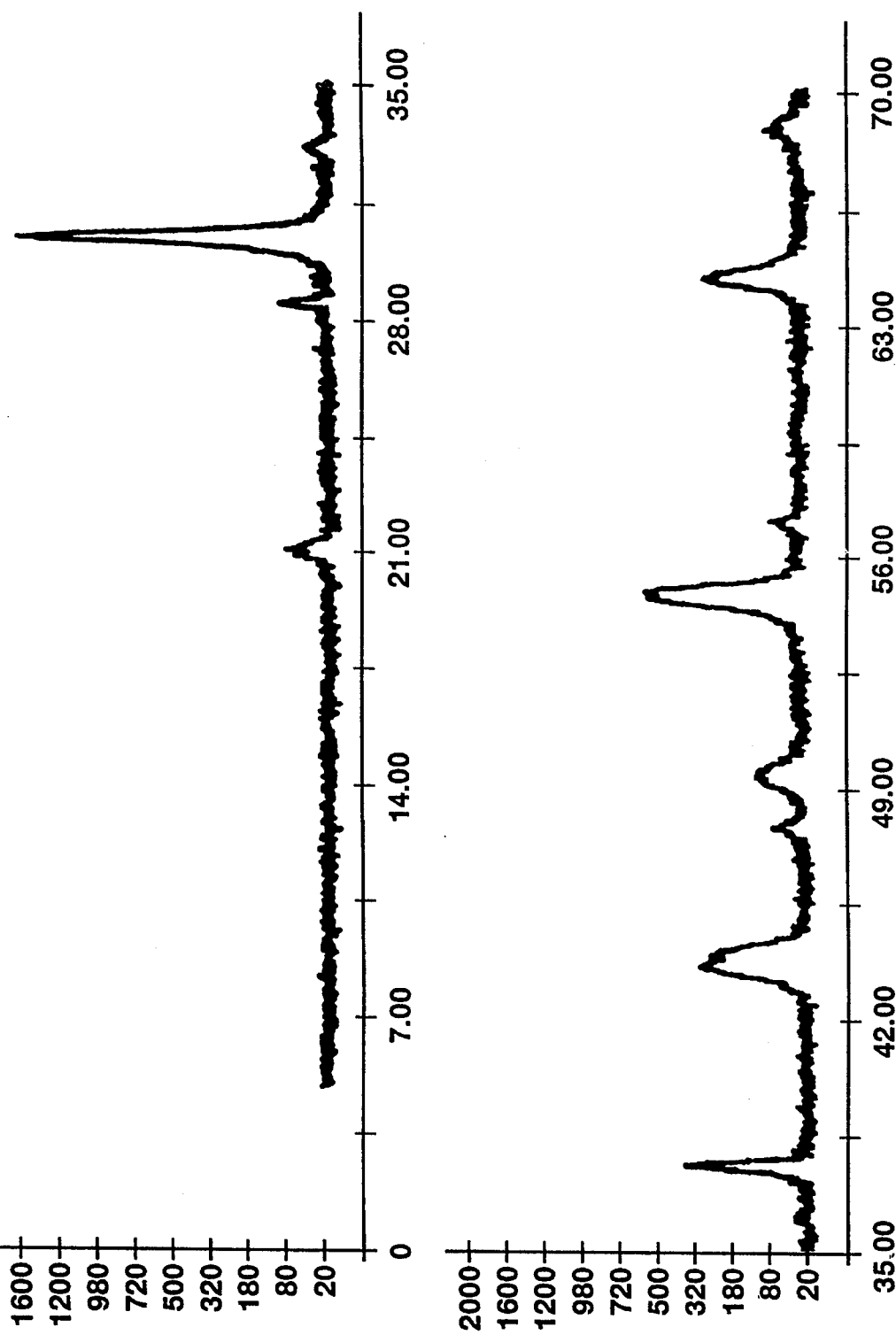
FIG_5

FIG_6A
0.05 Ba
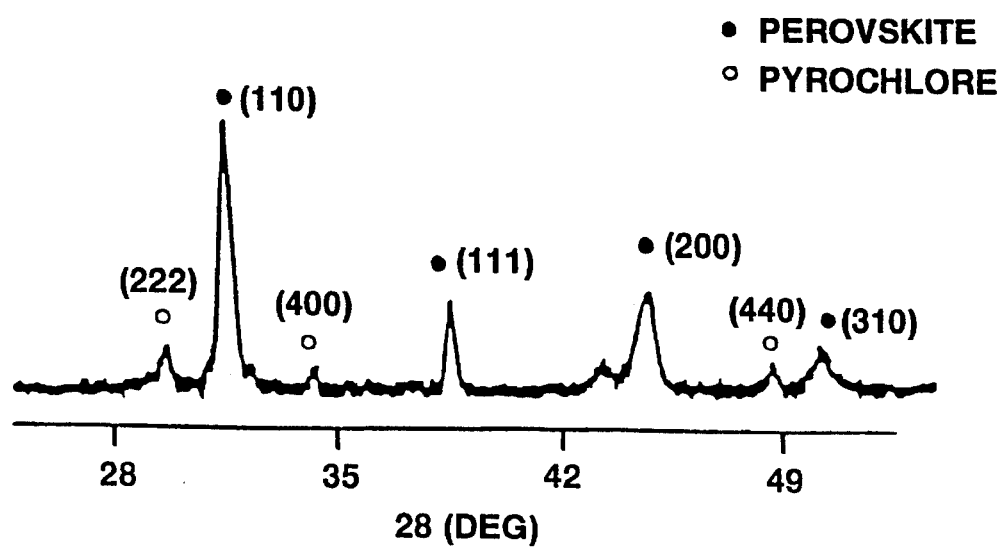
FIG_6B
0.1 Ba
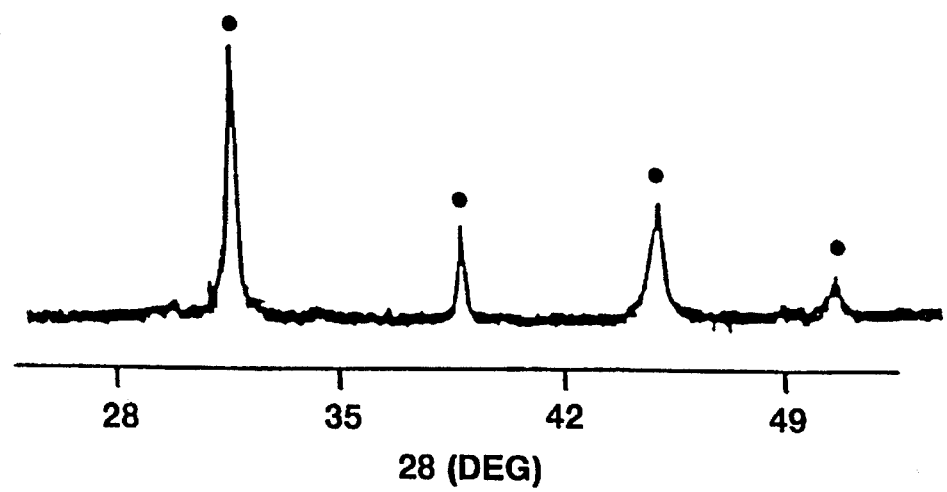

FIG_6C
0.05 Sr
- PEROVSKITE
- PYROCHLORE
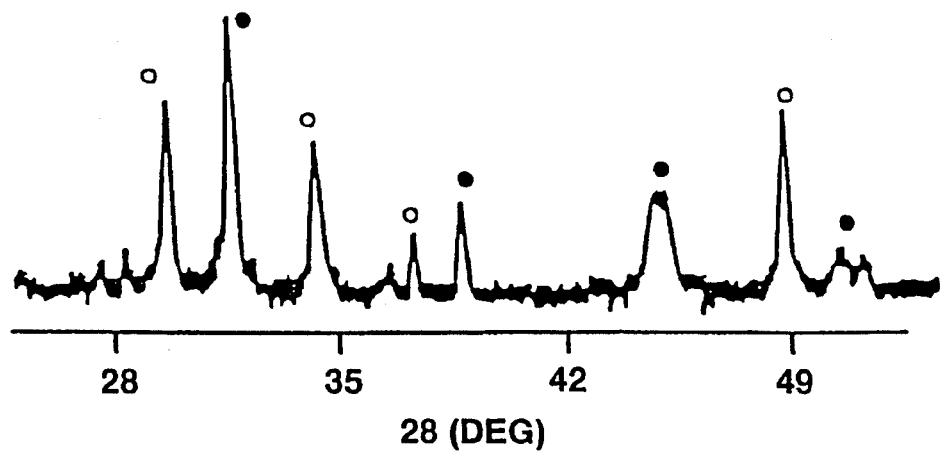
2θ (DEG)
FIG_6D
0.1 Sr
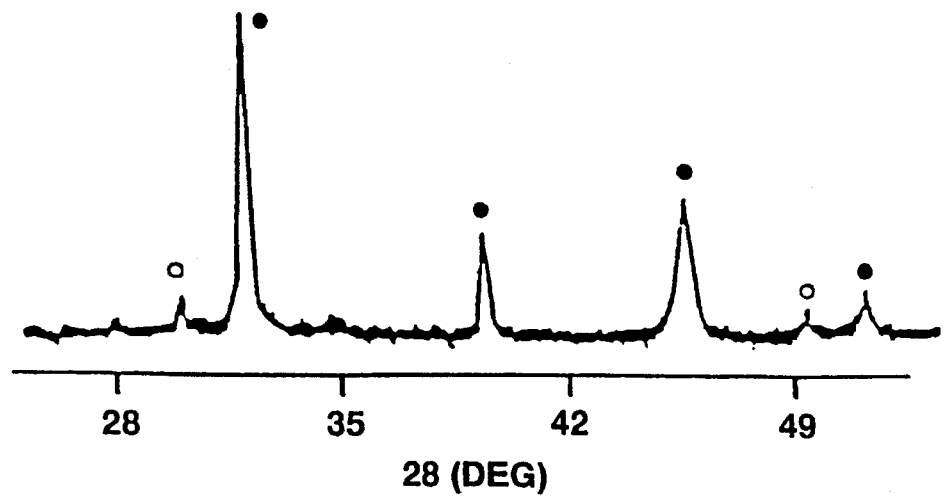
2θ (DEG)

FIG_7
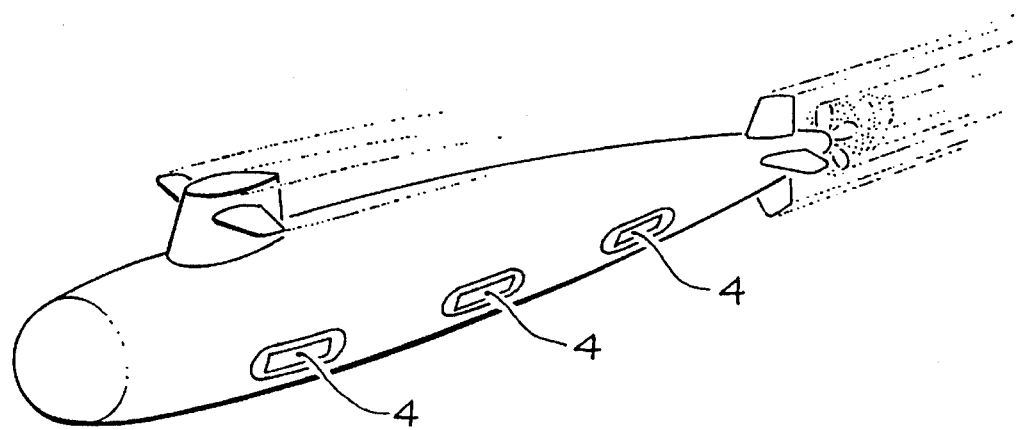
FIG_8
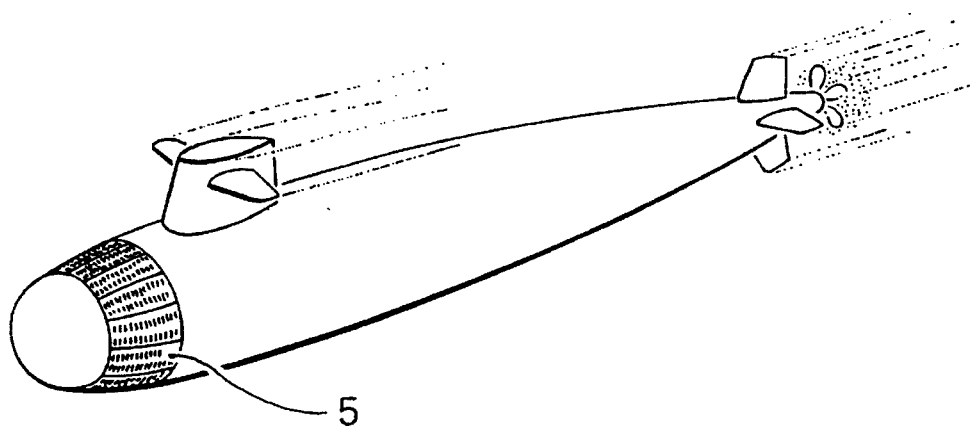
FIG_9
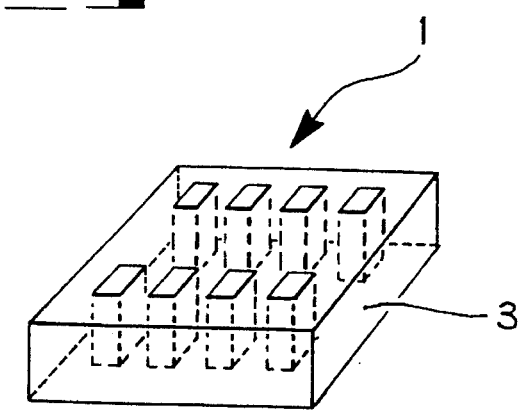

FIG_10A
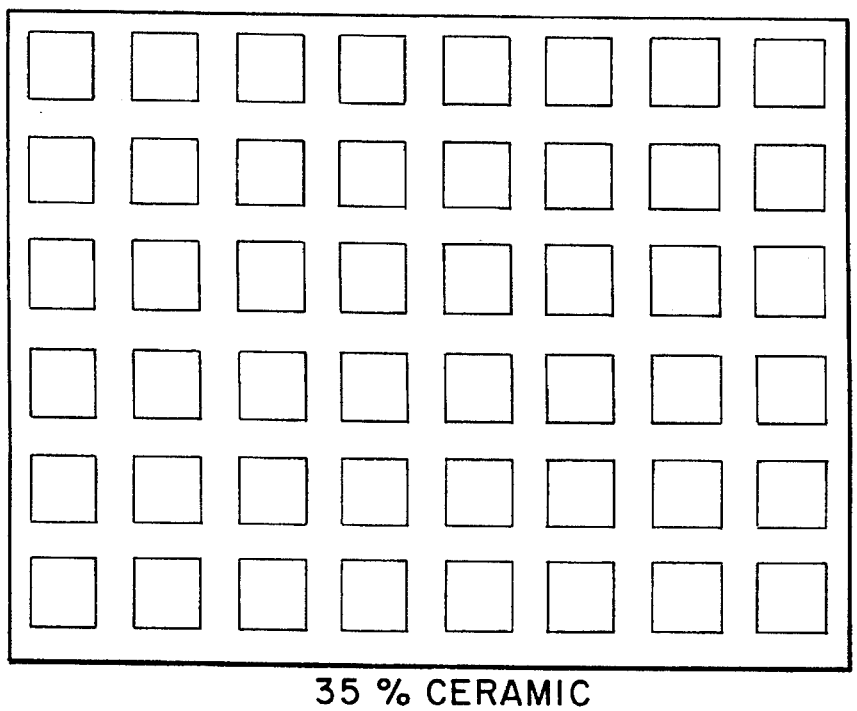
35 % CERAMIC
FIG_10B
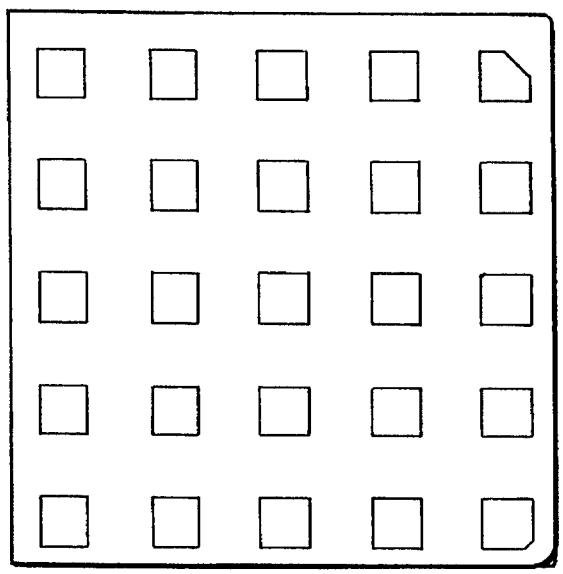
15 % CERAMIC

PIEZOELECTRIC CERAMIC MATERIAL INCLUDING PROCESSES FOR PREPARATION THEREOF AND APPLICATIONS THEREFOR

BACKGROUND OF THE INVENTION

1. Field of the Invention

This invention relates to new ceramic piezoelectric compositions, processes for preparing the piezoelectric ceramic materials and specific applications therefor.

2. Description of the Prior Art

A piezoelectric material is a material which generates a voltage when a mechanical stress is applied thereto. Moreover, when a voltage is applied to the piezoelectric material, mechanical deformation of the material will occur. Measures of piezoelectric activity include the "d" coefficients which relate electric charge and strain in the material. It is desirable to maximize these coefficients.

Perhaps the most promising group of piezoelectric materials are the family of complex niobates which have a perovskite or tungsten-bronze structure. This class of materials demonstrates outstanding electrical properties as single crystals. However, the use of single crystals for most ceramic applications is impractical. To date no one has been able to formulate acceptable polycrystalline materials of the ferroelectric perovskites which show the highest piezoelectric properties using standard ceramics technology. This is because non-piezoelectric phases, which are detrimental to the electrical properties of the ceramic, have been formed in addition to the desirable perovskite phase.

A polycrystalline ceramic material will display a piezoelectric effect if the material is anisotropic. In practice, polycrystalline piezoelectric materials are made anisotropic by heating the polycrystalline material to a temperature not far below the Curie temperature (Tc) of the material and thereafter cooling while in the presence of a strong electric field. This procedure will orient the otherwise randomly oriented dipoles of the polycrystalline material to result in a net distribution of positive and negative charges in the polycrystalline material (i.e., a dipole). Known piezoelectric materials include barium titanate, lead titanate, PZT (lead zirconate—lead titanate) and lead niobate.

The piezoelectric effect was discovered late in the 19th century and has been observed to occur in naturally occurring crystals such as quartz and Rochelle salt. However, the aforementioned polycrystalline ceramic materials have been focused upon by many researchers and have undergone constant improvement over recent years in an attempt to maximize electrical and physical properties thereof. The interest in polycrystalline ceramic piezoelectric materials is due to their use in such applications as transducers for sound (e.g., microphones, alarm systems), high power ultrasonic generators (e.g., sonar, ultrasonic cleaning), pick-ups and sensors (e.g., record players), resonators and filters (e.g., radio, television), etc.

Polycrystalline ceramic piezoelectric materials have received enormous attention because such materials can be readily formed into various shapes and sizes and thereafter poled (i.e., polarized) to result in a desirable net dipole orientation in the polycrystalline ceramic material. Moreover, ceramic piezoelectric materials borrow all of the desirable mechanical properties of ceramics generally, namely, high compressive strengths, good chemical resistivities, etc.

PZT is perhaps the most well known of the aforementioned ceramic materials (it is noted that PZT is a binary mixture of lead zirconate and lead titanate). PZT mixtures have been utilized for all of the various applications previously discussed, with minor compositional modifications being made to suit particular requirements. Attempts continue to be made to maximize the electrical properties of PZT ceramics, as well as the electrical properties of other ceramic compositions. Such electrical properties include dielectric constant (K), aging (i.e., piezoelectric deterioration with time), coupling coefficient, etc. However, as others have discovered, when one or more of the aforementioned properties is (are) maximized, one or more of the other properties may be adversely impacted. Accordingly, many researchers continue to search for an optimal polycrystalline ceramic piezoelectric material.

One of the many important applications for polycrystalline piezoelectric ceramics is as hydrophones in submarines for anti-submarine warfare. Particulary, piezoelectrics are used in targeting systems and in passive listening systems in submarines. When piezoelectric materials are used as hydrophones, piezoelectric properties such as $g_h$ (voltage coefficient), $d_{33}$, $d_{31}$ (piezoelectric strain coefficients in different crystallographic directions), $d_h$ (hydrostatic strain coefficient, wherein $d_h=d_{33}+2d_{31}$), and $d_h g_h$ (figure of merit which relates to the sensitivity of the hydrophone) are all important. Moreover, it is desirable to maximize $d_h$, $d_h g_h$ and K values in a hydrophone. Particularly, while efforts have been made to maximize $d_h$, known $d_h$ values for ceramics alone are not sufficient to be used in hydrophones for advanced sonar systems such as wide aperture and towed arrays. Furthermore, $g_h = d_h / \epsilon_o K$ and K must be a large value For example, when K is a large value and the piezoelectric material is electrically connected to amplifiers, cables, etc., an inexpensive (i.e., non-complex) preamplifier can be used. However, if K is a relatively low value, then expensive (i.e., complex) preamplification equipment is required. Additionally, the figure of merit must also be sufficient. Moreover, $g_h$ must also be a relatively high value, but, for typical ceramic compositions, both $g_h$ and K can not be simultaneously maximized. Thus, to enhance both $d_h$ and $g_h$, a composite material must be formed. It is clear that if $d_h g_h$ is too low, the sensitivity of the hydrophone will be insufficient for its intended purpose. The figure of merit is particularly important because modern submarines are much quieter than their predecessors and employ accoustic/magnetic/electric signature reduction technologies. As a consequence, more sensitive acoustic systems are needed as alternative means for submarine detection.

There are also known various manufacturing processes for the formation of polycrystalline ceramic piezoelectric materials. Such processes include conventional mixing of oxides, molten salt synthesis of PZT materials, as disclosed by Arendt et al (U.S. Pat. No. 4,152,281), and Woodhead et al (U.S. Pat. No. 3,725,298) have disclosed the use of the so-called sol-gel process for forming PZT. However, many investigators continue to search for a desirable process for forming desirable polycrystalline piezoelectric ceramic materials.

Moreover, efforts have been made to synthesize single crystal materials such as PZT and PZN-PT (i.e., lead zinc niobate-lead titanate). However, while various piezoelectric parameters are known for PZN-PT single crystals, to date there has been little research directed toward PZN-PT polycrystalline ceramic materials.

SUMMARY OF THE INVENTION

The present invention has been developed in view of the foregoing and to overcome the deficiencies the prior art.

It is an object of the invention to provide a novel polycrystalline ceramic piezoelectric composition which maximizes as many electrical properties as possible in the material.

It is a further object of the invention to provide a fabrication process for reliably obtaining the desired stoichiometry of the new piezoelectric material.

It is a still further object of the invention to utilize the new piezoelectric material in combination with another material (i.e., to form a composite), which can be used for such applications as hydrophones, robotics, tacticle pattern recognition sensors, ultrasonic transducers, etc.

Investigations have focussed upon the lead zinc niobate-lead titanate (PZN-PT) solid solution system. The PZN-PT solid solution can form the desirable perovskite crystal structure when doped with small amounts of such dopants as $BaTiO_3$ and $SrTiO_3$, the Ba and Sr replacing the lead (P) at the "A"-cation sites in the PZN-PT. It is desirable to synthesize compositions near the morphotropic boundary in the PZN-PT system to maximize the electrical properties of the PZN-PT material.

Still further, conventional oxide sintering techniques for forming the new PZN-PT composition are disclosed. Moreover, a sol-gel process for obtaining the novel PZN-PT composition even closer to the morphotropic phase boundary is also disclosed. The desirablility of utilizing a sol-gel process is due to the fine (i.e., small) particle size and homogeneous powder which results from organic precursors (typically metal alkoxides) which enable synthesis to occur at lower temperatures and without detrimental, non-piezoelectric phases. Thus, improved piezoelectric materials can be obtained by utilizing a sol-gel process.

The novel composition and process result in the production of a PZN-PT material that contains primarily the perovskite crystalline structure with only a small amount of barium titanate or strontium titanate being added, as a stabilizer. It has been determined that the PZN-PT composition can be placed very near the morphotropic phase boundary which results in the simultaneous maximization of piezoelectric values and dielectric constant.

BRIEF DESCRIPTION OF THE DRAWINGS

The invention is described in detail with reference to the accompanying drawings, wherein:

FIG. 1 is a ternary phase diagram of the system PZN-PT-(BT or ST);

FIG. 2 shows a relationship between percent of perovskite formed and different compositions, wherein $SrTiO_3$ is used as a dopant;

FIG. 3 shows a relationship between percent of perovskite formed and different compositions, wherein $BaTiO_3$ is used as a dopant;

FIG. 4 is an X-ray diffraction pattern of composition No. 4 with $BaTiO_3$ as a dopant;

FIG. 5 is an X-ray diffraction pattern of composition No. 5 with $BaTiO_3$ as a dopant;

FIG. 6 shows four different X-ray diffraction patterns for four different PZN-PT-XT compositons, wherein X=Ba or Sr;

FIG. 7 shows a typical wide aperture array (WAA) sonar used for targeting in submarines;

FIG. 8 shows a typical advanced conformal sonar array for submarines (ACSAS) used for listening in submarines;

FIG. 9 shows a 3–1 composite material according to the present invention; and FIG. 10A shows a 3–1 composite material having 35% ceramic and FIG. 10B shows a 3–1 composite material having 15% ceramic.

DETAILED DESCRIPTION OF THE INVENTION

1. New Piezoelectric Composition

FIG. 1 shows the ternary phase diagram for the system PZN-PT-BT and the system PZN-PT-ST. The reference letter "M" represents the projection of the morphotropic boundary for the system. Moreover, each of the compositional points, represented by the numerals 1–11, are shown in the following Table 1.

TABLE 1

| Sample No. | Composition |
| --- | --- |
| 1 | 0.60PZN-0.20PT-0.20X |
| 2 | 0.70PZN-0.20PT-0.10X |
| 4 | 0.855PZN-0.095PT-0.05X |
| 5 | 0.873PZN-0.097PT-0.03X |
| 6 | 0.87PZN-0.11PT-0.02X |
| 7 | 0.875PZN-0.115PT-0.01X |
| 8 | 0.840PZN-0.135PT-0.025X |
| 9 | 0.825PZN-0.145PT-0.03X |
| 10 | 0.860PZN-0.105PT-0.035X |
| 11 | 0.860.PZN-0.120PT-0.020X |

X = $BaTiO_3$ and/or $SrTiO_3$

It was determined that barium titanate ($BaTiO_3$) and strontium titanate ($SrTiO_3$) were the best dopants to be added to the PZN-PT binary composition, to stabilize the system, with barium titanate providing slightly better results than strontium titanate.

EXPERIMENTAL PROCEDURE

The ceramic compositions recited in Table 1 and disclosed in FIG. 1 were obtained by the following procedure.

Puratronic grade oxides were jar milled thoroughly and calcined at both 800° C. and 1000° C. for 2 hours. The calcined powder was ground in an agate mortar and isostatically pressed at 45,000 psi (without binder). Pellets were fired in open crucibles at 1050° C. for 1 hour.

FIG. 2 and FIG. 3 show the percent perovskite which is formed for compositions 1, 2, 4 and 5 when these compositions were calcined at 800° C.; calcined at 1000° C.; calcined at 800° C. and sintered at 1050° C.; and calcined at 1000° C. and sintered at 1050° C. $SrTiO_3$ was the dopant used in FIG. 2 and $BaTiO_3$ was the dopant used in FIG. 3. Of all the compositions tested, compositions #4 and #5 yielded the highest percentage of perovskite and the best electrical properties. The percent of perovskite present was determined by the following equation:

$$\% \text{ perovskite} = \frac{I \text{ perov.}}{(I_{perov.} + I_{pyro})}$$

wherein $I_{perov.}$ is the intensity of the principal X-ray diffraction peak for perovskite and $I_{pyro}$ is the intensity of the principal X-ray diffraction peak for pyrochlore.

FIGS. 2 and 3 demonstrate that as the compositon moves closer to the morphotropic boundary and thus closer to pure PZN-PT (i.e., from compositions #1 to #2 to #4 to #5), the perovskite becomes less stable during firing and a pyrochlore phase results. While some samples corresponding to compositon #1 and #2 (20 and 10 mol % dopant, respectively) yielded high percentages of the perovskite phase, their electrical properties were poor. Table 2 discloses the range of $d_{33}$ values and K(max) for each of compositions 1, 2, 4 and 5.

TABLE 2

| Composition | $d_{33}$ range | K (max) |
|---|---|---|
| SrTiO3 | | |
| #1 | 35–44 | — |
| #2 | 92–126 | 524 |
| #4 | 166–298 | 1490 |
| #5 | 213–354 | 1224 |
| BaTiO$_3$ | | |
| #1 | Breakdown due to pyrochlore | — |
| #2 | Breakdown due to pyrochlore | — |
| #4 | 115–334 | 1760 |
| #5 | 115–350 | 1433 |

Due to the desirable combinations of properties which occur for compositons #4 and #5, a more detailed investigation of those compositions was made. BaTiO$_3$ was the only dopant focussed upon for these specific compositions.

Starting powders of Puratronic grade (99.999+%) PbO, ZnO, Nb$_2$O$_5$, TiO$_2$ and BaCO$_3$ (SrCO$_3$ can be used if Sr is the desired dopant) were mixed in stoichiometric proportions to yield compositions #4 and #5 (0.855 PZN—0.095 PT—0.05 BT and 0.873 PZN—0.097 PT—0.03 BT). The powder mixture was wet (Freon) milled until a homogeneous mixture was obtained. The wet milled mixture was then dried and calcined in a closed platinum crucible for approximately four hours at 800° C. The calcined powder was then wet milled again to reduce the particle size. The second wet milling occurred for approximately 40 hours to result in an average particle size in the material of approximately 10 microns.

Three weight percent of PVA (Air Products #205) binder was then dissolved in distilled water. The calcined powder was then added to the liquid mixture. The powder-binder mixture was stirred on a hot plate until all water had evaporated. The hot plate was at a temperature of approximately 95° C. and the elapsed time was approximately 6 hours. The dried mass was then ground to –100 mesh and die pressed into a pellet under a pressure of about 5,000 psi. The pellets were then isostatically pressed at about 45,000 psi. The isostatically pressed pellets were packed in a powder of a substantially similar chemical composition to the pellets. This step is important because when the pellet-powder mixture was then placed in closed alumina crucibles and when heated, the atmosphere created in the alumina crucibles was similar in chemical composition to the chemical composition of the pellets, thereby preventing volatilization of elements such as Pb, and hence deviatiion of the ceramic from stoichiometry. The alumina crucibles were then heated for binder burnout at a heating rate of approximately 40° C. per hour until a temperature of 600° C. was reached. The pellets were then heated at 900° C. per hour until a temperature of 1050° C. was reached. The pellets were maintained at approximately 1050° C. for about 1–2 hours followed by a cooling of the furnace.

The range of densities for composition #4 was 7.45–7.53 g/cm$^3$ and the range of densities for composition #5 was 6.91–7.10 g/cm$^3$ with a theoretical density being approximately 8.24 g/cm$^3$. The lower densities for composition #5 was due to the formation of the pyrochlore phase. It was determined that the weight loss during sintering averaged approximately 3.2 weight %, of which 3 weight % was binder. X-ray diffraction analysis of the resulting material verified that composition #4 was 100% perovskite, as shown in FIG. 4 herein. The X-ray diffraction pattern for composition #5 is shown in FIG. 5. The fired pellets were then wafered into discs having a thickness of 1–4 mm. The discs were then electroded with silver paint. The Curie temperature for composition #4 was determined to be 175° C. and the Curie temperature for composition #5 was determined to be 160° C. The Curie temperatures were determined by measuring capacitance over a temperature range of 25° C.–200° C. in a silicone oil bath.

SEM-EDS analysis was utilized to determine the stoichiometry of the sintered pellets corresponding to compositions #4 and #5. Particularly, Table 3 herein shows that 10 separate points of analysis were made on the pellets with the average composition and theoretical compositions being shown therein.

TABLE 3

| Analysis Point | Formula |
|---|---|
| Composition #4 | |
| 1 | $Pb_{1.02}Zn_{.30}Nb_{.54}Ti_{.15}Ba_{.04}O_3$ |
| 2 | $Pb_{1.05}Zn_{.30}Nb_{.54}Ti_{.14}Ba_{.04}O_3$ |
| 3 | $Pb_{1.05}Zn_{.30}Nb_{.54}Ti_{.12}Ba_{.05}O_3$ |
| 4 | $Pb_{1.04}Zn_{.30}Nb_{.53}Ti_{.13}Ba_{.07}O_3$ |
| 5 | $Pb_{1.03}Zn_{.33}Nb_{.56}Ti_{.09}Ba_{.06}O_3$ |
| 6 | $Pb_{1.04}Zn_{.32}Nb_{.52}Ti_{.15}Ba_{.03}O_3$ |
| 7 | $Pb_{1.04}Zn_{.29}Nb_{.51}Ti_{.16}Ba_{.06}O_3$ |
| 8 | $Pb_{1.00}Zn_{.27}Nb_{.54}Ti_{.17}Ba_{.06}O_3$ |
| 9 | $Pb_{1.07}Zn_{.29}Nb_{.52}Ti_{.15}Ba_{.04}O_3$ |
| 10 | $Pb_{1.04}Zn_{.29}Nb_{.53}Ti_{.13}Ba_{.08}O_3$ |
| AVE | $Pb_{1.04}Zn_{.30}Nb_{.53}Ti_{.14}Ba_{.05}O_3$ |
| THEO | $Pb_{.95}Zn_{.28}Nb_{.57}Ti_{.15}Ba_{.05}O_3$ |
| Composition #5 | |
| 1 | $Pb_{1.07}Zn_{.28}Nb_{.55}Ti_{.14}Ba_{.00}O_3$ |
| 2 | $Pb_{1.06}Zn_{.27}Nb_{.55}Ti_{.14}Ba_{.02}O_3$ |
| 3 | $Pb_{1.05}Zn_{.32}Nb_{.58}Ti_{.07}Ba_{.05}O_3$ |
| 4 | $Pb_{1.06}Zn_{.30}Nb_{.54}Ti_{.12}Ba_{.04}O_3$ |
| 5 | $Pb_{1.09}Zn_{.29}Nb_{.55}Ti_{.10}Ba_{.04}O_3$ |
| 6 | $Pb_{1.06}Zn_{.24}Nb_{.55}Ti_{.14}Ba_{.05}O_3$ |
| 7 | $Pb_{1.12}Zn_{.29}Nb_{.55}Ti_{.08}Ba_{.05}O_3$ |
| 8 | $Pb_{1.07}Zn_{.25}Nb_{.54}Ti_{.14}Ba_{.04}O_3$ |
| 9 | $Pb_{1.06}Zn_{.30}Nb_{.54}Ti_{.12}Ba_{.04}O_3$ |
| 10 | $Pb_{1.07}Zn_{.29}Nb_{.53}Ti_{.14}Ba_{.04}O_3$ |
| AVE | $Pb_{1.07}Zn_{.28}Nb_{.55}Ti_{.12}Ba_{.04}O_3$ |
| STOICH | $Pb_{.97}Zn_{.29}Nb_{.58}Ti_{.13}Ba_{.03}O_3$ |

All the samples were then poled by typical poling procedures which involved placing the samples in a light weight inert oil, such as silicone oil, which was heated to 160° C. The samples were subjected to an electric potential of approximately 2 Kv/mm for a period of time between 20 and 60 minutes. The samples were then aged for several days. The peak $d_{33}$ value for composition #4 was measured to be 754×10$^{-12}$ C/N and 549×10$^{-12}$ C/N for composition #5 immediately after poling. The electrical data obtained after appropriate aging is shown in Table 4. Dielectric constants as high as 3252 were obtained for composition #4.

Moreover, the electrical properties of novel compositions #4 and #5 are compared with known electrical compositions of other materials in Table 5 herein.

TABLE 5

Electrical Properties of BaTiO₃-doped PZN-PT

| Material | K | $d_{33}$ | $d_{31}$ | $d_h$ | $g_h$ | $d_h g_h$ |
|---|---|---|---|---|---|---|
| PZT | 1800 | 450 | −205 | 40 | 2.5 | 100 |
| PbNb₂O₆ | 225 | 85 | −10 | 65 | 35.0 | 2300 |
| Ba(PZN-PT) #4 | 2860 | 540 | −228 | 84 | 3.3 | 279 |
| Ba(PZN-PT) #5 | 1825 | 440 | −196 | 48 | 3.0 | 143 |

It is clear from Table 5 that the present composition, particularly composition #4, produces superior properties over known compositions. Specifically, in reference to composition #4, the hydrostatic piezoelectric strain coefficient ($d_h$) is far superior to known compositions and the figure of merit ($d_h g_h$) and $d_{33}$ (piezoelectric strain cofficient) are both very desirable. Accordingly, novel composition #4 produces a material which has three times the sensitivity of PZT materials but also has a high dielectric constant which results in lowered loss of electric signals when coupled to pre-amplifierws or cables. Accordingly, composition #4 produces a combination of electrical properties which are superior to any

TABLE 4

| Sample | $d_{33}$ Avg (× $10^{-12}$ m²/N) | $d_h$ Avg (× $10^{-12}$ m²/N) | $d_{31}$ Avg (× $10^{-12}$ m²/N) | K (1kHz) at 25° C. | Loss (1kHz) at 25° C. | $g_h$ Avg (× $10^{-3}$ m²/N) | $d_h g_h$ (× $10^{-15}$) |
|---|---|---|---|---|---|---|---|
| | | | Composition #4 | | | | |
| 1 | 691 | 75.5 | −308 | 2650 | .032 | 3.2 | 242 |
| 2 | 485 | 88.4 | −198 | 3252 | .038 | 3.1 | 274 |
| 3 | 475 | 89.9 | −193 | 2760 | .040 | 3.7 | 333 |
| 4 | 500 | 82.5 | −209 | 2793 | .040 | 3.3 | 272 |
| | | | Composition #5 | | | | |
| 5 | 440 | 47.7 | −196 | 1825 | — | 3.0 | 143 | electrical properties previously known for composite ceramic materials.

2. Sol-Gel Preparation of New Piezoelectric Material

It has been discovered that sol-gel processing of the piezoelectric material discussed above can result in an almost 100% perovskite PZN-PT structure obtained at 30 mol % PT (undoped). Such 100% perovskite structure was previously known to exist at only 50 mol % PT. The difference in the approximately 20 mol % presence of PT was because previously utilized techniques involved the conventional sintering of oxides. Thus, it is clear that the sol-gel-derived powders can improve the amount of perovskite phase present. Once this determination has been made, other parameters such as sintering temperature, sintering time, heating rate and dopant additions an also be adjusted in an attempt to maximize the percent of perovskite present. The discovery of the 100% perovskite was surprising because one of ordinary skill would typically expect a substantial amount of pyrochlore to be present at that concentration of lead titanate (PT). However, to obtain 100% perovskite, special processing steps must be followed.

Metal organic precursors for PZN-PT solid solutions, including those doped with Ba, Sr and BaTiO₃ (BT), were prepared by chemical reactions between lead acetate, zinc acetate, niobium isopropoxide and titanium isopropoxide. Reagent grade lead acetate, zinc acetate and titanium isopropoxide were obtained commercially Niobium isopropoxide was prepared by the reaction between niobium pentachloride and isopropanol in the presence of anhydrous ammonia. Solutions of barium and strontium were prepared by dissolving pure metals in 2-methoxyethanol.

Appropriate molar amounts of lead acetate and zinc acetate were dissolved in 2-methoxyethanol in a reaction flask and were refluxed for about two hours at 120° C. under constant stirring conditions. As an alternative to refluxing, heating can occur in an open container. The primary purpose of the heating is to drive off any water and acetate. However, when heating occurs in an open container, it may be necessary to add 2-methoxyethanol to prevent the mixture from completely drying out. The typical heating time is 1–2 hours under constant stirring conditions and the mixture is heated to approximately the boiling point of the alcohol (i.e., 120° C.). It is critical that the heating (i.e., refluxing or heating in an open container) occurs for a sufficient amount of time to remove all acetate from the mixture. If either refluxing or heating in an open container is utilized, it may be desirable to add isopropanol. If care is not taken to remove all acetate at this point, various undesirable intermediate materials may result which hinder the formation of the desired ceramic composition.

After all acetate has been driven off, the solution is then cooled to approximately room temperature and appropriate amounts of niobium and titanium isopropoxide are then added to the mixture. The resulting solution is clear and must be further refluxed for approximately 2 hours at 120° C. and thereafter cooled to room temperature. When Ba or Sr dopants are used, it is critical that the barium or strontium be added after cooling of the reaction mixture because if heating is employed subsequent to the addition of the barium or strontium, then undesirable precipitation would occur. The mixture is then allowed to gel by the slow addition of a mixture of 2-methoxyethanol/water in a range of 7:3–8:2 by volume. The clear gel is then air dried for a period of time of 1–2 weeks and thereafter at 50° C. in a vacuum. The dried gel is then crushed into a powder and heated gradually up to 500° C.–600° C. to decompose and remove all organics from the powder. The powder is then finely ground and pressed into pellets. The pellets are then sintered in air at a temperature of 900° C.–1100° C. for a period of time of 15 minutes–2 hours. The phase composition of the pellets can then be determined by X-ray diffraction.

The sintered pellets were then cut into wafers of approximately 1½ centimeter diameter and 0.7–2 millimeter thickness. The wafers were then ground to a flat surface, electroded with silver and poled in a silicone oil bath at approximately 130° C. using a DC electric field of 1–2 kV for approximately 15 minutes. Electrical properties such as $d_{33}$ and dielectric constant (K) were then measured using a $d_{33}$ meter and an impedance analyzer, respectively. It should be noted that the relative amount of perovskite was determined from the intensity ratios of the perovskite (110) peak and the pyrochlore (222) peak, as previously discussed.

FIG. 6 shows four different X-ray diffraction patterns for different PZN-PT-XT compositions, wherein X=Ba or Sr. Moreover, Table 6 lists the amount of dopant substituted for lead in the composition 0.9 PZN—0.1 PT solid solution. The X-ray diffraction patterns were obtained before poling of the wafers.

TABLE 6

| Dopant Substitution | Perovskite % |
|---|---|
| None | 10 |
| 0.05 Ba | 90 |
| 0.10 Ba | 100 |
| 0.20 Ba | 100 |
| 0.05 Sr | 70 |
| 0.10 Sr | 95 |
| 0.20 Sr | 100 |

As shown, the substitution of 5 mole % Ba for Pb in the PZN results in approximately 90% perovskite and therefore yields a substantially pyrochlore-free composition. A similar trend is noted for Pb substitution by Sr.

As shown in Table 7 herein, variations in sintering temperature, sintering time and heating rate produced different effects in both PZN-PT materials and PZN-PT-BT materials, including optimized compositions #4 and #5 as discussed above herein in relation to the mixed synthesis.

Accordingly, sol-gel processing of PZN-PT solid solutions shows an increased formation of the perovskite phase over anything previously known. The phase stability is further improved by the partial substitution of Pb by Ba or Sr. The electrical properties show a correlation with the amount of the perovskite phase as well as a dependence on the nature and amount of the dopants. By optimizing the parameters of the sol-gel process, the sintering process, and the amount of the dopants, a pyrochlore-free PZN-PT solid solution near the morphotropic phase boundary can now be obtained.

3. Composite Piezoelectric Hydrophone

The piezoelectric materials discussed above can be utilized such for applications as passive sonar listening devices (hydrophones) utilized in submarines. If the piezoelectric material is utilized in a wide aperture array (WAA) or in advanced conformal sonar array for submarines (ACSAS), a combination of the piezoelectric material with a polymer material is desirable. A typical WAA is shown in FIG. 7 and represented by the numeral 4, while a typical ACSAS is shown in FIG. 8 and represented by the numeral 5.

The ceramic piezoelectric materials previously discussed are very desirable for use in a composite hydrophone application because of their high $d_h$ and $d_{33}$ values. Moreover, the high dielectric constant provides for considerable dilution without severely comprising the final dielectric constant, and thus, capacitance of the composite. The

TABLE 7

| Sintering Conditions | | | | | Electrical Parameters | | |
|---|---|---|---|---|---|---|---|
| Temp (°C.) | Time (min) | Rate | Perkovskite (%) | Density (g/cm³) | Tanδ | Dielectric Const. (K) | $d_{33}$pC/N |
| PZN-PT (88:12) | | | | | | | |
| 1000 | 30 | Normal | 88 | 6.46 | 0.060 | 261 | 27 |
| 1000 | 15 | Rapid | 70 | 6.43 | 0.053 | 197 | 16 |
| 1000 | 30 | Rapid | 76 | 6.35 | 0.101 | 230 | 21 |
| 1100 | 30 | Normal | 25 | 5.46 | | | |
| 1100 | 15 | Rapid | 43 | 6.68 | 0.096 | 240 | 17 |
| 1100 | 30 | Rapid | 55 | 6.84 | 0.046 | 222 | 16 |
| PZN-PT (91:9) | | | | | | | |
| 1000 | 30 | Normal | 59 | 6.72 | 0.024 | 224 | 15 |
| 1000 | 30 | Rapid | 82 | 6.80 | 0.042 | 203 | 13 |
| 1100 | 30 | Normal | 0 | 5.11 | | | |
| 1100 | 15 | Rapid | 41 | 6.38 | 0.039 | 197 | 11 |
| PZN-PT-BT (Comp #4) 0.855 PZN - 0.095 PT - 0.05 BT | | | | | | | |
| 1050 | 60 | Normal | 95 | 7.55 | 0.043 | 2607 | 319 |
| 1050 | 60 | Rapid | 100 | 6.98 | 0.042 | 2063 | 204 |
| PZN-PT-BT (Comp #5) 0.873 PZN - 0.097 PT - 0.03 BT | | | | | | | |
| 1050 | 60 | Normal | 100 | 7.43 | 0.038 | 3036 | 707 |
| 1050 | 120 | Normal | 98 | 7.40 | 0.035 | 2856 | 451 |
| 1050 | 60 | Rapid | 91 | 7.37 | 0.032 | 2381 | 211 | wherein,
Normal = 10° C./min Heating Rate
Rapid = 200° C./min Heating Rate

It is clear from Table 7 that approximately 100% of the perovskite phase, for each of compositions #4 and #5 can be attained.

already existent large anisotropy in the piezoelectric strain coefficients ($d_{33}$, $d_h$) can be further enhanced by using the proper connectivity in the composite.

This new material does best in a 3–1 connectivity which follows the Newnham notation. In such a composite, the active phase (i.e., PZN-PT) is connected in one dimension, namely, the thickness, while the polymer matrix is connected in three dimensions. FIG. 9 shows a 3–1 composite material wherein the composite is represented by the numeral 1, the ceramic piezoelectric is represented by the numeral 2 and the polymer (i.e., epoxy matrix) is represented by the numeral 3. When using the 3–1 connectivity, the electrical properties of the composite can be determined according to the following:

| | | |
|---|---|---|
| K avg | = | % ceramic × K ceramic |
| $d_{33}$ avg | = | $d_{33}$ ceramic |
| $d_{31}$ avg | = | % ceramic × $d_{31}$ ceramic |
| $d_h$ avg | = | $d_{33}$ ceramic + 2 (% ceramic × $D_{33}$ ceramic) |
| $g_h$ avg | = | $d_h$ avg/% ceramic × Kavg |

The procedure for forming these 3–1 composite materials is discussed as follows:

Two different procedures have been developed, largely by research conducted at the Material Research Laboratories at the Pennsylvania State University, for the preparation of 3–1 composites. In one technique (Klicker et al, 1982) a polymer matrix is cast around extruded piezoelectric rods, said rods having been presintered, but not poled. The rods are held in place by alignment plates made by drilling holes through thin metal plates. Changes in the number and location of the holes, together with the diameter of the rods, are used to vary the volume fraction of the active piezoelectric phase in the composite. This technique is very labor intensive and requires that the ceramic rods be extruded and fired prior to composite fabrication. The other known technique, known as "dice and fill" is much better suited to laboratory scale prototype device fabrication, and was the technique used herein.

In the dice and fill method, sintered, monolithic blocks of ceramic are temporarily bonded to a machined metal block using "Crystalbond", which is a pine resin that softens around 90°–120° C. Typical dimensions of the cylindrical ceramic blocks range from 10–20 mm in diameter and about 4 mm thick. Using a high speed precision grinder and thin diamond impregnated blades, parallel cuts are first made in the block in one direction and then, by rotating the specimen 90°, in a perpendicular direction therein. The cuts are ground most of the way through the thickness of the material, leaving about 1 mm of solid ceramic to support the rods being cut. By using diamond blades of different width and by varying the amount that the blade is displaced between each cut, ceramic rods, or "pillars", of various thicknesses and spacing remain after the two step grinding is performed. Blades having thicknesses between 0.015 and 0.05 inches were used to cut the specimens into ceramic pillars which were between 0.5 and 1 mm wide, and spacings of about 0.5 to 2 mm. These variations are realized in differences in the volume fraction of active piezoelectric in the inert polymer matrix.

After the ceramic block is ground, it is debonded from the metal block, rinsed and ultrasonically cleaned in acetone, first, to remove all of the Crystalbond, and in freon. This procedure thoroughly degreases the ceramic (i.e., removes the cutting fluids used during the high-speed grinding). The ceramic is then dried in an oven at about 100° C. If the ceramic block was poled before grinding, heating of the sample is minimized; in those cases, the sample should be debonded from the metal block by soaking in acetone, rather than by heating, and the finished specimen dried by holding in a vacuum oven at about 60° C. for several hours.

The ground ceramic is then placed in a metal or plastic form and epoxy is poured around the sample. Spurrs epoxy, a material used primarily for casting biological specimens, has been successfully utilized as the matrix material primarily because of its low viscosity and its ability to change its compliance by varying the ratio of the constituents (i.e., it is a four part epoxy). The sample and uncured epoxy are placed in a vacuum chamber and the system is evacuated until no more bubbles come from the ceramic piece, (i.e., the ceramic is impregnated by the epoxy). The epoxy is then cured according to manufacturer's specifications, generally about 8 hours at 60° C.

The cured epoxy block, containing the ceramic piece, is trimmed to expose the ceramic rods, and the solid ceramic base holding the rod is cut or ground off. A combination of techniques, including use of petrographic thin-sectioning equipment, low speed diamond saws, and hand lapping with abrasive grits, have been used to trim the excess epoxy. The 3–1 polymer-ceramic composite is now electroded by painting the surface with silver-loaded paint, and then poled, if poling was not performed prior to grinding. Measurement of the piezoelectric constant, $d_{33}$, indicates that lower $d_{33}$ values are found for ceramic rods embedded in the composite than in similarly poled monolithic pieces of the same ceramic. The values for the ceramic in the composite tend to be only about 75% of the value for the solid pieces. Several theories could explain this behavior, including unexpected field gradients in the composite during poling and confining stress on the piezoelectric elements from the epoxy, the precise mechansim causing this behavior is not known.

It is known that the best hydrostatic piezoelectric properties are obtained if the top and bottom surfaces of the composites (i.e., the electroded ends normal to the rods) are stiffened with thin metal plates (0.050 in.). Brass plates are then bonded to the composites using silver-loaded conductive epoxy. Such procedures result in significant improvements in the $d_h$ coefficients, with greater improvements seen as the volume fraction of ceramic decreased. For example, the $d_h$ value for the 35 vol % composite increased from 55 to 85 pC/N when brass plates were used, and that for the 15 vol % increased from 5 to 160 pC/N.

Table 8 discloses the electrical properties for the monolith and for a composite body made using 5%, 15% and 35% loading of PZN-PT-BT corresponding to composition #4. Further, FIG. 10A and FIG. 10B disclose a 35% loaded composite and a 15% loaded composite, respectively, wherein the ceramic piezoelectric material corresponds to composition #4.

TABLE 8

Electrical Properties of Piezoelectric Composites

| Property | Monolith | Ceramic 5% | 15% | 35% |
|---|---|---|---|---|
| K | 2860 | 123 | 406 | 1180 |
| $d_h$ (PC/N) | 84 | 51 | 162 | 85 |
| $g_h$ (mVm/N) | 3.3 | 46 | 45 | 8.2 |
| $d_h g_h$ (×10$^{-15}$ m$^2$/N) | 279 | 2343 | 7290 | 695 |

It is clear that the 3–1 composite which was loaded with 15% ceramic produced the highest $d_h g_h$ and $d_n$ values of the three composite materials. Still further, when comparing the $d_h g_h$ values with known values of piezoelectric monoliths currently in use in hydrophones, the $d_h g_h$ values are four times greater and the dielectric constant K is twice that which is known. Accordingly, the 15% loaded 3–1 composite material produces very desirable properties.

Because the exact mechanisms by which 3–1 composites enhance piezoelectric properties are not well established, additional investigation is needed. Variables which effect the composite include the degree of bonding of the polymer to the ceramic rods, stiffness of the polymer matrix, volume fraction of the active elements, and effects of inert stiffening elements, including the metal electrode plates and internal elements like glass rods.

While the present invention has been disclosed in its preferred embodiments, it is to be understood that the invention is not limited to the precise disclosure contained herein, but may otherwise be embodied with various changes, modifications and improvements which may occur to those skilled in the art, without departing from the scope of the invention as defined in the appended claims.

We claim:

1. A piezoelectric ceramic composition comprising a solid solution of 85.5–87.5 molar percent lead zinc niobate, 9.5–9.7 molar percent lead titanate and 3–5 molar percent of a dopant consisting of strontium titanate.

2. A sintered piezoelectric ceramic comprising a solid solution of about 87.3 molar percent lead zinc niobate, about 9.7 molar percent lead titanate and about 3 percent of a dopant consisting of barium titanate, said sintered piezoelectric ceramic having a crystal phase of substantially 100 volume percent perovskite, a $d_{33}$ of at least 700 picoCoulombs per Newton and a dielectric constant of at least 3000.

3. A sintered piezoelectric ceramic comprising a solid solution of about 85.5 molar percent of lead zinc niobate, about 9.5 molar percent of lead titanate and about 5 molar percent of a dopant consisting of barium titanate, said sintered piezoelectric ceramic having a crystal phase of at least 90 volume percent perovskite, a $d_{33}$ of at least about 540 picoCoulombs per Newton and a dielectric constant of at least about 2650.

4. A method of making a piezoelectric material comprising:

mixing together puratronic grade powders having a purity of at least 99.999 percent of PbO, ZnO, $Nb_2O_5$, $TiO_2$ and at least one dopant material selected from the group consisting of $SrCO_3$ and $BaCO_3$ in appropriate proportions to result in a solid solution of 85.5–87.3 molar percent lead zinc niobate, 9.5–9.7 molar percent lead titanate and 3–5 molar percent of at least one dopant selected from the group consisting of barium titanate and strontium titanate to form a mixture;

wet milling said mixture;

drying and calcining said mixture;

wet milling said mixture a second time to result in a powder having an average particle size of about 10 microns;

forming a binder-distilled water mixture;

adding said 10 micron powder to said binder-distilled water mixture to form a slurry;

evaporating all water from the slurry to form a dried mass;

grinding the dried mass to –100 mesh powder;

dry pressing and isostatically pressing the –100 mesh powder into pellets;

packing the pellets into a powder having substantially the same chemical composition of the pellets; and firing the pellets.

5. A sintered piezoelectric produced according to the process of claim 4, wherein the sintered piezoelectric has a density of about 6.91–7.53 g/cm³ and a Curie temperature of about 160° C.–175° C.

6. The method of claim 4, wherein the puratronic grade powders having a purity of at least 99.999 percent are mixed in appropriate proportions to result in a solid solution of about 85.5 molar percent lead zinc niobate, about 9.5 molar percent lead titanate and about 5 molar percent of barium titanate.

7. A sintered piezoelectric produced according to the process of claim 6, wherein the sintered piezoelectric has a density of about 7.45–7.53 g/cm³ and a crystal phase of about 100% perovskite.

8. A method of making a piezoelectric material comprising:

dissolving lead acetate and zinc acetate in 2-methoxyethanol to form a first solution;

heating said first solution to drive off water and acetate from the first solution;

cooling said heated first solution to form a first cooled solution;

adding niobium and titanium isopropoxide to said first cooled solution to form a second solution;

heating the second solution;

cooling the second solution to form a second cooled solution;

gelling the second solution to form a gel;

drying the gel;

crushing the gel to form a powder;

removing substantially all organics from the powder;

forming the powder into pellets; and sintering the pellets.

9. The method of claim 8, wherein alcohol is added to said first solution during heating to prevent the first solution from completely drying.

10. The method of claim 8, wherein said heating of the first and second solutions occurs for 1–2 hours at a temperature of about 120° C.

11. The method of claim 8, wherein the second solution is gelled by adding a mixture of 2-methoxyethanol/water in a range of 7:3–8:2 by volume.

12. The method of claim 8, wherein the gel is dried for about 1–2 weeks and thereafter at about 50° C. in a vacuum.

13. The method of claim 8, wherein the organics are removed by gradual heating up to a temperature of about 500° C.–600° C.

14. The method of claim 8, wherein the pellets are sintered in air at a temperature of 900° C.–1100° C. for a period of time of 15 minutes–2 hours.

15. A method of making a piezoelectric material comprising:

dissolving lead acetate and zinc acetate in 2-methoxyethanol to form a first solution;

heating said first solution to drive off water and acetate from the first solution;

cooling said heated first solution to form a first cooled solution;

adding niobium and titanium isopropoxide to said first cooled solution to form a second solution;

heating the second solution;

cooling the second solution to form a second cooled solution;

mixing a dopant material selected from the group consisting of Ba and Sr together with the cooled second solution to form a third solution;

gelling the third solution to form a gel;

drying the gel;

crushing the gel to form a powder;

removing substantially all organics from the powder;

forming the powder into pellets; and sintering the pellets, wherein no heating occurs after the dopant material is mixed with the cooled second solution until the gel has been dried.

16. The method of claim 15, wherein alcohol is added to said first solution during heating to prevent the first solution from completely drying.

17. The method of claim 15, wherein said heating of the first and second solutions occurs for 1–2 hours at a temperature of about 120° C.

18. The method of claim 15, wherein the second solution is gelled by adding a mixture of 2-methoxyethanol/water in a range of 7:3–8:2 by volume.

19. The method of claim 15, wherein the gel is dried for about 1–2 weeks and thereafter at about 50° C. in a vacuum.

20. The method of claim 15, wherein the organics are removed by gradual heating up to a temperature of about 500° C.–600° C.

21. The method of claim 15, wherein the pellets are sintered in air at a temperature of 900° C.–1100° C. for a period of time of 15 minutes–2 hours.

22. The method of claim 15, wherein said lead acetate, zinc acetate, niobium isopropoxide, titanium isopropoxide and said dopant of Ba are mixed together in appropriate amounts to result in a solid solution of 85.5–87.5 molar percent lead zinc niobate, 9.5–9.7 molar percent lead titanate and 3–5 molar percent barium titanate.

23. The method of claim 22, wherein said sintering occurs at a temperature of 1050° C. for a period of time of about 1–2 hours.

24. The method of claim 23, wherein a heating rate of about 10° C./minute–200° C./minute is used to reach said temperature of 1050° C.

25. A sintered piezoelectric produced according to the process of claim 22, wherein the sintered piezoelectric contains at least 91% perovskite by volume and has a density of 6.98–7.55 g/cm$^3$, a dielectric constant of 2063–3036 and a $d_{33}$ of 204–707 picoCoulombs per Newton.

* * * * *